United States Patent
Baker et al.

(10) Patent No.: US 7,941,056 B2
(45) Date of Patent: May 10, 2011

(54) OPTICAL INTERCONNECT IN HIGH-SPEED MEMORY SYSTEMS

(75) Inventors: Russel J. Baker, Boise, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 981 days.

(21) Appl. No.: 09/941,557

(22) Filed: Aug. 30, 2001

(65) Prior Publication Data

US 2003/0043426 A1    Mar. 6, 2003

(51) Int. Cl.
*H04B 10/00* (2006.01)
(52) U.S. Cl. .................. 398/164; 398/162; 398/195
(58) Field of Classification Search .............. 398/151, 398/162–167, 195–196
See application file for complete search history.

(56) References Cited

U.S. PATENT DOCUMENTS

| | | | |
|---|---|---|---|
| 4,707,823 A | 11/1987 | Holdren et al. | |
| 5,146,607 A * | 9/1992 | Sood et al. | 711/211 |
| 5,243,703 A | 9/1993 | Farmwald et al. | |
| 5,319,755 A | 6/1994 | Farmwald et al. | |
| 5,355,391 A | 10/1994 | Horowitz et al. | |
| 5,367,397 A * | 11/1994 | Tajima | 398/137 |
| 5,432,823 A | 7/1995 | Gasbarro et al. | |
| 5,544,319 A * | 8/1996 | Acton et al. | 709/246 |
| 5,581,767 A | 12/1996 | Katsuki | |
| 5,606,717 A | 2/1997 | Farmwald et al. | |
| 5,638,334 A | 6/1997 | Farmwald et al. | |
| 5,903,370 A * | 5/1999 | Johnson | 398/4 |
| 5,928,343 A | 7/1999 | Farmwald et al. | |
| 6,185,352 B1 | 2/2001 | Hurley | |
| 6,222,861 B1 * | 4/2001 | Kuo et al. | 372/20 |
| 6,498,775 B1 * | 12/2002 | Fan et al. | 369/94 |
| 6,529,534 B1 * | 3/2003 | Yasuda | 372/32 |
| 6,603,896 B1 * | 8/2003 | MacCormack et al. | 385/24 |
| 6,651,139 B1 * | 11/2003 | Ozeki et al. | 711/118 |
| 6,658,210 B1 * | 12/2003 | Fee | 398/79 |
| 6,782,017 B1 * | 8/2004 | Kai et al. | 372/29.02 |
| 6,782,209 B2 * | 8/2004 | Copeland et al. | 398/157 |
| 7,133,610 B1 * | 11/2006 | Shimura et al. | 398/15 |
| 2001/0015837 A1 * | 8/2001 | Hung | 359/124 |

FOREIGN PATENT DOCUMENTS

| | | |
|---|---|---|
| EP | 849685 | 6/1998 |
| WO | WO 93/19422 | 9/1993 |

* cited by examiner

*Primary Examiner* — Dzung D Tran
(74) *Attorney, Agent, or Firm* — Dickstein Shapiro LLP (57) ABSTRACT

A optical link for achieving electrical isolation between a controller and a memory device is disclosed. The optical link increases the noise immunity of electrical interconnections, and allows the memory device to be placed a greater distance from the processor than is conventional without power-consuming I/O buffers.

46 Claims, 7 Drawing Sheets

OPTICAL INTERCONNECT IN HIGH-SPEED MEMORY SYSTEMS

FIELD OF THE INVENTION

The present invention relates to communicating at high speed data signals to and from memory storage devices such as DRAM memory devices.

BACKGROUND OF THE INVENTION

As computer processor and DRAM (Dynamic Random Access Memory) memory speeds increase, their bus speeds increase also. This increased speed also increases signal noise at connection points where a memory controller and DRAM memory devices connect to a bus. In addition, the connections of the bus also have associated electrical properties such as capacitance and inductance which, while causing minimal problems at low data speeds, causes increasingly significant problems at high speed. Consequently, at high speed, conventional bus arrangements can introduce signal distortion, noise, delays and other unwanted spurious signal phenomenon.

Current memory devices commonly operate at hundreds of megahertz, but it is anticipated that computer bus speeds, which tend to run slightly slower than microprocessor speeds, will soon extend beyond 1 GHz. At such high frequencies, the minutest amount of signal aberration caused by the electrical properties of the electrical bus may cause severe and unexpected consequences. Additionally, the distance between components on a bus must be kept short, to minimize signal distortions and help insure that data and control signals reach their destination very quickly.

Accordingly, a memory bus structure which reduces or eliminates signal distortion, noise, and other problems and permits reliable high speed (e.g. greater than 1 GHz) operation is desired.

BRIEF SUMMARY OF THE INVENTION

In one aspect the invention provides a memory apparatus and method of its operation which utilizes an optical path connected between a memory controller or processor and at least one memory device for passing data between the controller or processor and memory device at high throughput speed.

BRIEF DESCRIPTION OF THE DRAWINGS

The foregoing and other features and advantages of the invention will become more apparent from the detailed description of the exemplary embodiments of the invention given below with reference to the accompanying drawings in which.

DETAILED DESCRIPTION OF THE PREFERRED EMBODIMENTS

Figure 1:
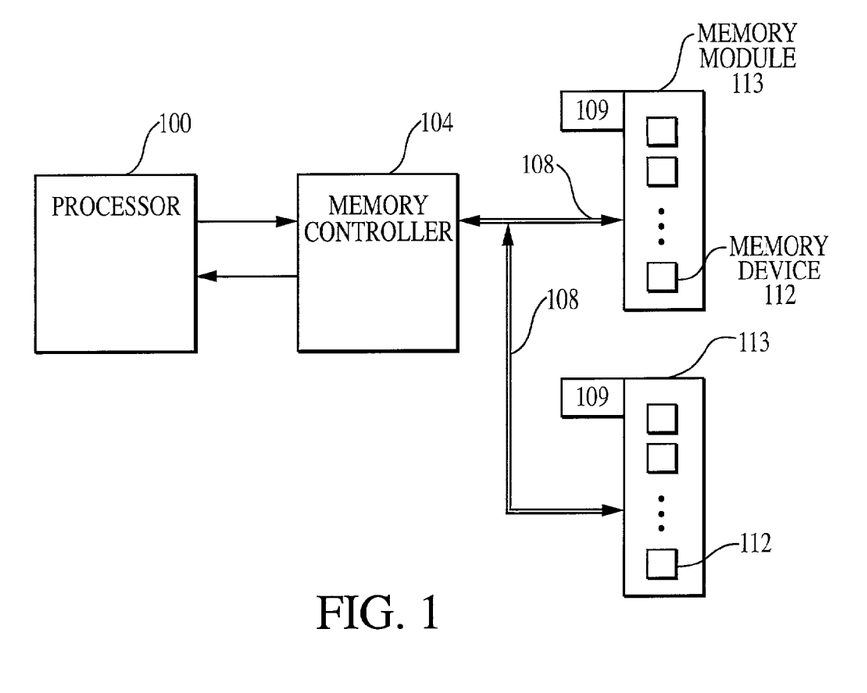
FIG. 1 shows a generic overview of the present invention.

The present invention uses one or more optical links between a processor and/or a memory controller and a DRAM memory device. The optical link includes, but is not limited, to optical fiber and optical waveguide links as described below in connection with various exemplary embodiments of the invention. FIG. 1 shows a high level block diagram of the present invention. A processor 100 is connected to a memory controller 104 which in turn is connected to a memory module 113 containing one or more memory devices 112 using one or more optical links 108. The memory controller 104 and modules 113 have optical couplers which enable them to connect to the optical links 108 to maintain optical continuity. The modules 113 have optical plug-in connectors to the optical links 108, but also have standard (non-optical) Dual Inline Memory Module (DIMM) connectors 109 for supplying power and other low-frequency signals.

In the context of the invention, the processor 100, controller 104, and memory devices 112 can be located either on the same die or located on separate dies. In some cases, processor 100 can also serve as the memory controller 104 in which case a separate memory controller 104 can be omitted.

Figure 2:
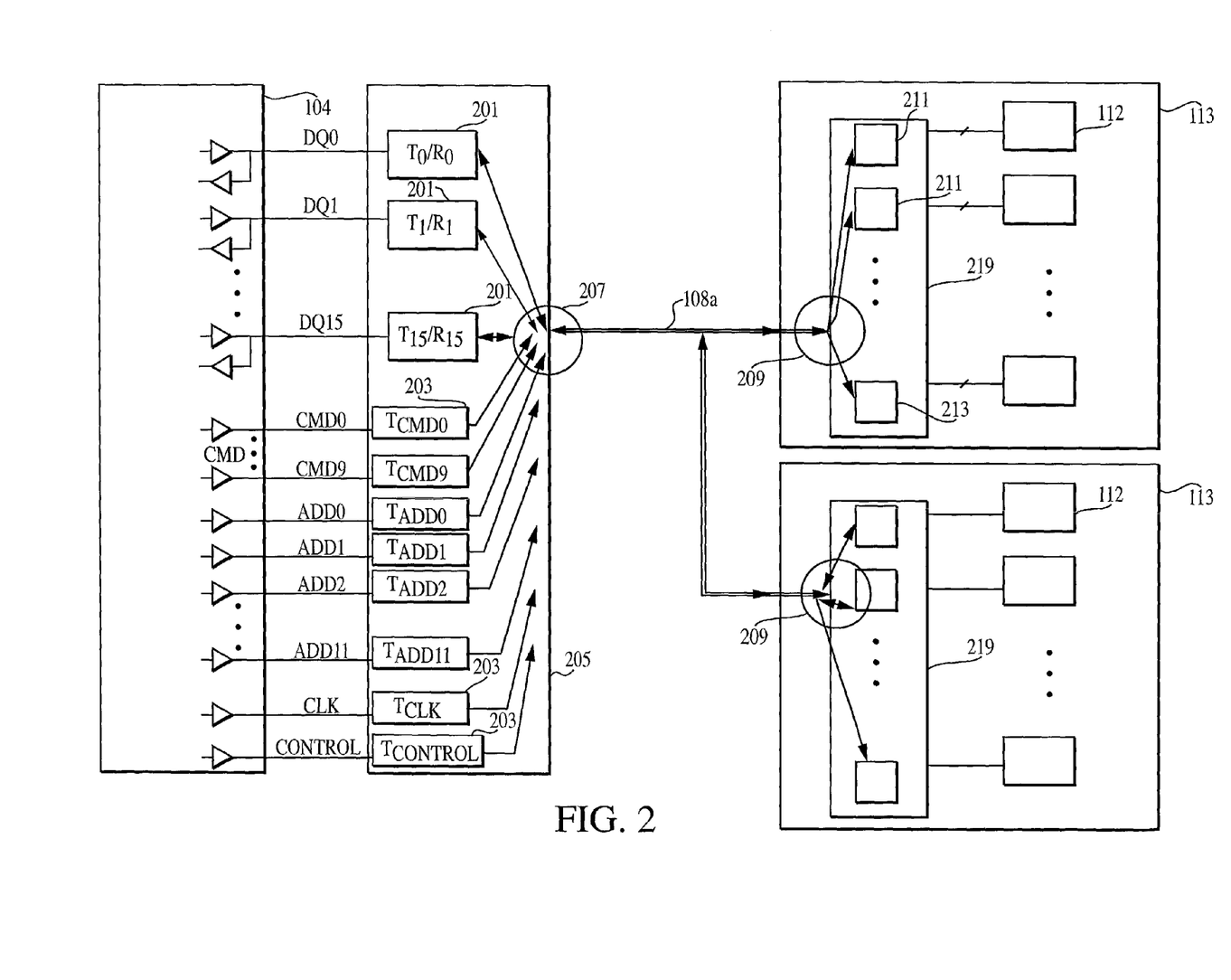
FIG. 2 shows one exemplary embodiment of the invention.

FIG. 2 shows a first exemplary embodiment of the invention in which a single common optical link 108a transmits a plurality of data streams between a memory controller 104 and memory modules 113 using paired optical transmitters and receivers on opposite sides of link 108a pre-set to communicate at a respective wavelength. FIG. 2 shows the use of separate data (DQ), command (CMD), address (ADD), and clock (CLK) paths between controller 104 and each memory module 113 as is typical in a computer bus structure. It is also possible to send control and address data over the same data paths as is also well known in the art. For brevity, only the data (DQ) optical path will be discussed in detail, it being understood that the optical paths for other data and clock information sent by the controller will be handled the same except for the direction of data/clock pulse flow. It should also be understood that while the data (DQ) paths are bidirectional, the command/address and clock paths are unidirectional in that the dataflow is from controller 104 to the modules 113 and associated memory devices 112.

As shown in FIG. 2, each data DQ path of the memory controller 104 is coupled to a respective optical transmitting/receiving device $T_0/R_0 \ldots T_{15}/R_{15}$, each collectively identified by the label 201. Each transmitting/receiving device converts an electrical signal received from a DQ path of memory controller 114 and converts the electrical signal to an optical signal for transmission on optical link 108a to a memory module 113 over optical link 108a. Each transmitter/receiver 201 is also capable of receiving an optical signal from a module 113 and converting it to an electrical signal and sending it to controller 104 on a respective data (DQ) path.

In addition to the transmitter/receivers 201 provided on the controller side, respective transmitters 203 are also provided for converting each of the electrical signals on the command, address and clock signal paths to optical signals over link 108a and transmitting these optical signals to modules 113. The transmitter/receivers 201 and transmitters 203 may form part of an electrical/optical converter 205.

The FIG. 2 embodiment uses a single optical link 108a constructed as an optical fiber or optical waveguide between controller 104 and the memory modules 113. In this way, many datapins of controller 104 communicate over a single optical link 108a. In order to keep the optical signals from the different data (DQ), command (CMD), address (ADDRESS), and clock (CLK) paths from interfering with each other, wave division multiplexing is employed so that the optical signals from each of the transmitter/receiver devices 201 and transmitter devices 203 have a respective optical carrier wavelength (frequency) which is modulated by data sent on the various signal paths from controller 104 to converter 205. Likewise, the optical receiver portion of each transmitter/receiver 201 operates at a respective optical wavelength.

As further shown in FIG. 2, the various optical signals from transmitter/receivers 201 and transmitters 203 are optically combined in a multiplexing portion of a wavelength division multiplexer/demultiplexer 207 for transmission over the common optical link 108a to memory modules 113.

Each module 113 also contains a wave division multiplexer/demultiplexer 209 which receives the optically multiplexed signals on optical link 108a and wavelength demultiplexes them in a demutiplexer portion and passes the demuliplexed signals to respective transmitter/receivers 211, which electrically connect to the data (DQ) paths of the memory devices 112. In addition, the demultiplexed optical signals for the command (CMD), address (ADD) (or combined command/address) and clock (CLK) signal paths are passed on to receivers 213 which convert optical signals to electrical signals which are electrically coupled to the electrical command (CMD), address (ADD) and clock (CLK) signal paths of the memory devices 112.

Data read from memory devices 112 is transmitted on the data (DQ) paths of the memory devices 112 to respective transmitter/receivers 211 where the electrical data is converted to an optical signal at a respective wavelength and sent to multiplexer/demultiplexer 209 where the data on the respective DQ optical paths is combined in the wave division multiplexer of multiplexer/demultiplexer 209. This data is then sent over optical link 108a to multiplexer/demultiplexer 207 where it is demultiplexed and passed to respective transmitter/receivers 201 where the DQ optical data is connected to electrical DQ data which is sent to respective DQ data paths of controller 104. FIG. 2 illustates the optical coupling of two memory modules 113 to memory controller 104 through the electro-optical converter 205 provided at the memory controller 104 side of optical link 108 and an electro-optical converter and 219 provided on the memory modules 113; however, it should be understood that any number of memory modules 113, containing any number of memory devices 112, may be optically coupled to controller 104 over optical link 108a.

Figure 3:
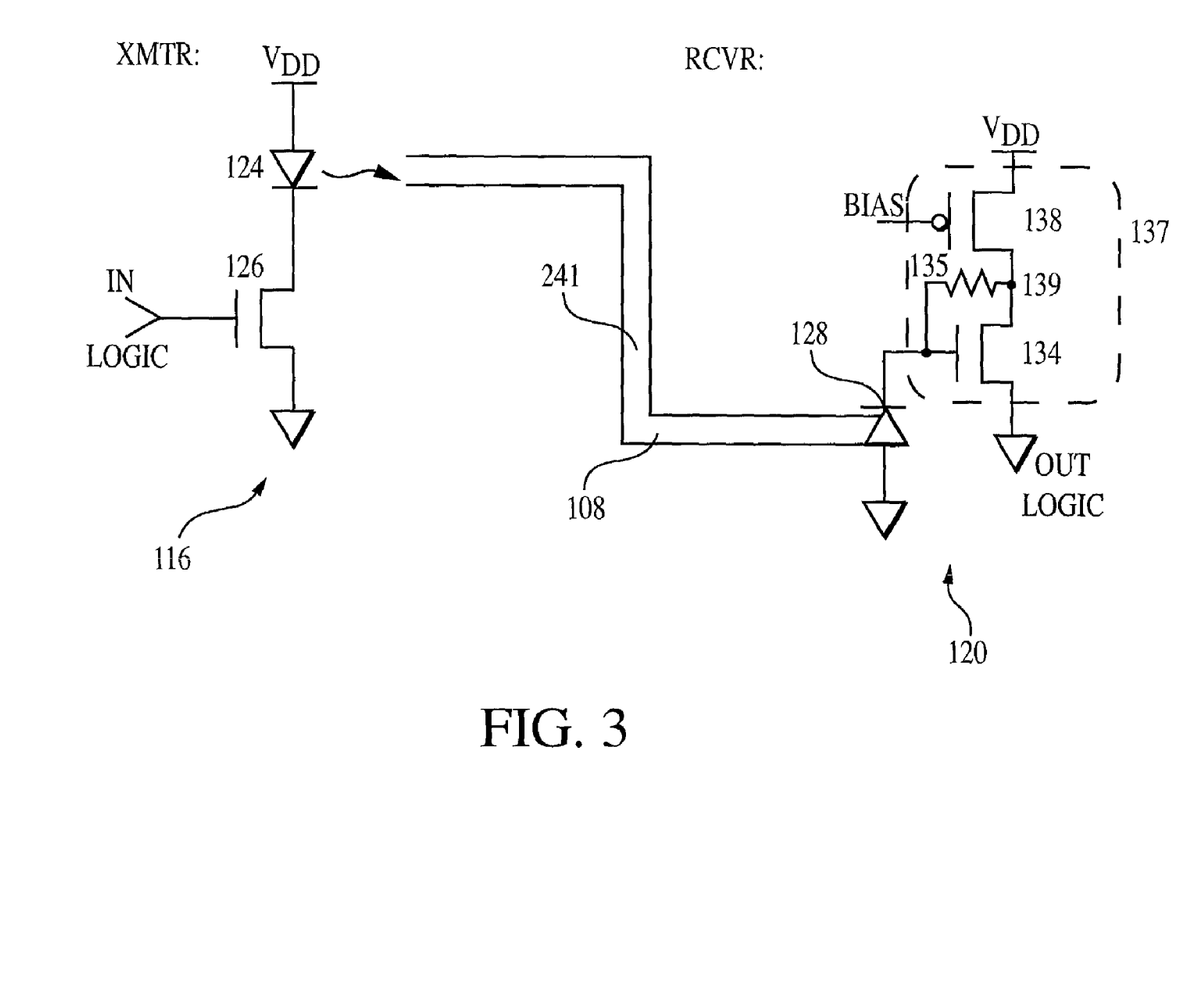
FIG. 3 shows a transistor-level view of the transmitter and receiver used in an exemplary embodiment of the invention.

FIG. 3 shows a simplified optical transmitter 116 and optical receiver 120 which may be used in the electro/optical transmitter/receivers 201, 211 and in the electro/optical transmitters 203 and receivers 213. A LED (Light Emitting Diode) or ILD (Injection Laser Diode) light emitter 124 in transmitter 116 provides a light output signal to an optical path 241 at a predefined wavelength, in response to an applied electrical signal at the gate of a transistor 126. At the receiver 120 side, a photodiode 128 couples light pulses received from an optical path 241 to the gate of an n-channel transistor 134. A p-channel biasing transistor 138 sources current to the n-channel transistor 134. A resistor 135 is positioned between the gate of transistor 134, as well as the drain of transistor 138. The transistors 134 and 138 and resistor 135 form an inverting amplifier 137. The output 139 of the inverting amplifier 137 is an electrical signal.

Although FIG. 3 illustrates the light transmitter 116 and receiver 120 as discrete components, these devices are actually integrated devices which may be integrated together with multiplexer/demultiplexer 207 on a converter 205 chip or integrated on the same chip as the memory controller 104. At the module 113, the transmitter 116 and receiver 120 are preferably integrated on the same chip which contains the multiplexer/demultiplexer 209. It is also possible to integrate the transmitter 116 and receiver 120 on the module side within the actual memory devices 112 in which case each memory device 112 would contain its own converter circuit 219 shown in FIG. 3.

Although a silicon substrate may be used for integrating the LED or ILD light emitter 124 and/or photodiode 128, the more preferred substrate material for such devices, particularly for LED or ILD 124 is gallium arsenide, as known in the art. Finally, it should be understood that while FIG. 3 illustrates a unidirectional data path, in actuality the data (DQ) paths in a memory system are bidirectional and that an optical transmitter 116 and receiver 120 are therefore understood to be employed at each path end of a bidirectional optical link 108a, as shown by transmitter/receivers 201 and 211.

As noted, the FIG. 2 arrangement relies on wavelength division multiplexing of the different signal paths which exist between memory controllers 104 and the individual memory devices 112. Thus, each transmitter/receiver 201, transmitter 203 and receiver 235 as well as multiplexer/demultiplexers 207, 209 must operate at specified optical wavelengths. These wavelengths can be controlled using known filter circuits. However, it is often difficult to ensure that a manufacturer's device operates precisely at a predetermined wavelength. To this end, it is also known to adjust operating conditions of an electro/optical device to ensure that it operates at a predetermined wavelength.

Figure 4:
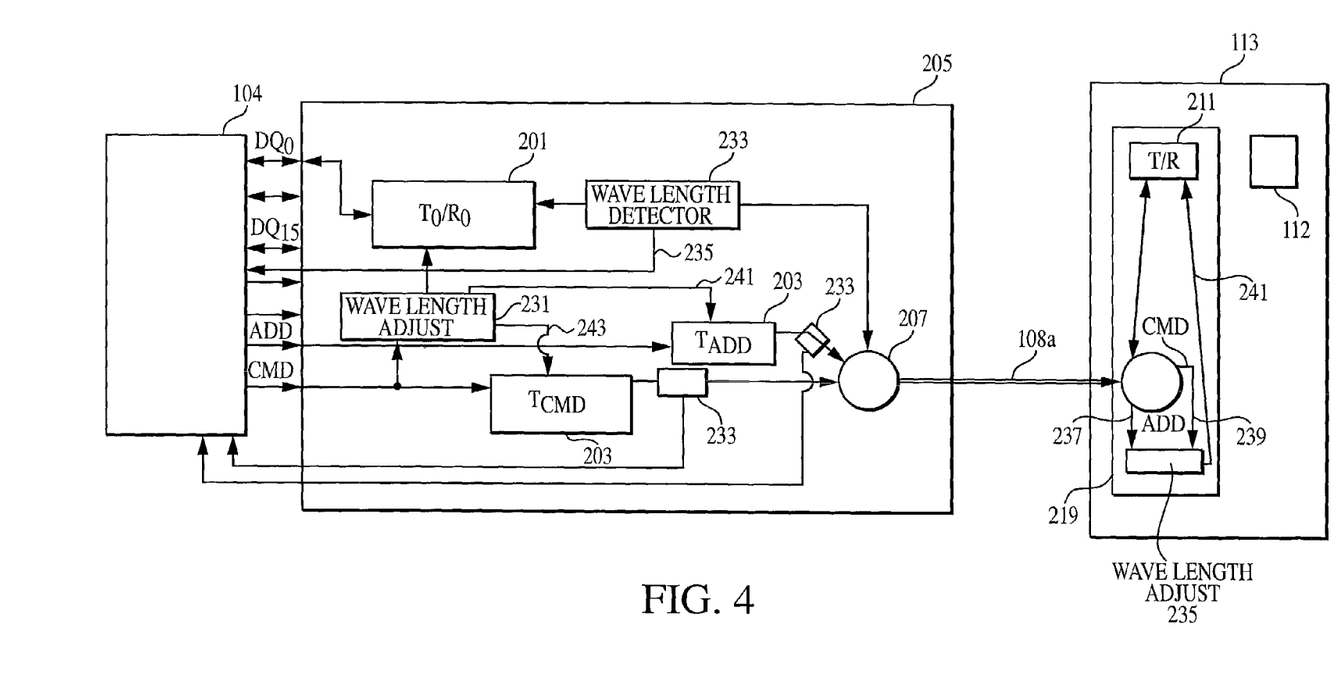
FIG. 4 shows a second exemplary embodiment of the invention.

FIG. 4 shows a modification of a portion of the system of FIG. 2, where transmitting devices 201 and receiving devices 203 are shown as being wavelength-adjustable. For clarity, only the DQ0 pin is shown, while DQ1-DQ15 are implied, similar to the representation in FIG. 2. During fabrication, the thicknesses and purities of the materials deposited as well as other factors make it difficult to fabricate a transmitter 203 and the transmitter portion of receiver/transmitters 201 and 211 to transmit at a precise predefined wavelength. Accordingly, the light emitters are wavelength adjustable. Wavelength detectors 233 are used to sense the nominal wavelength of an optically transmitted signal from each of the transmitters of devices 201 and 203 and data representing the sensed wavelength is fed back to controller 104 which determines if a transmitter is transmitting at its assigned wavelength and, if not, a wavelength adjuster 231 is operated by controller 104 which sends data to an addressed wavelength adjuster 231 for adjusting the wavelength over the command (CMD) signal path. Separate control signal paths can also be used for this purpose. The wavelength of optical signals sent by the data transmitters 211 in the modules 113 can also be sensed by the wavelength detector 233 and adjustment data can be sent to addressed wavelength adjuster 235 on the module 113 which adjusts the wavelength of the transmitter portion of transmitter/receiver 211. The adjustments can be accomplished during initialization of the memory system for operation.

Figure 5:
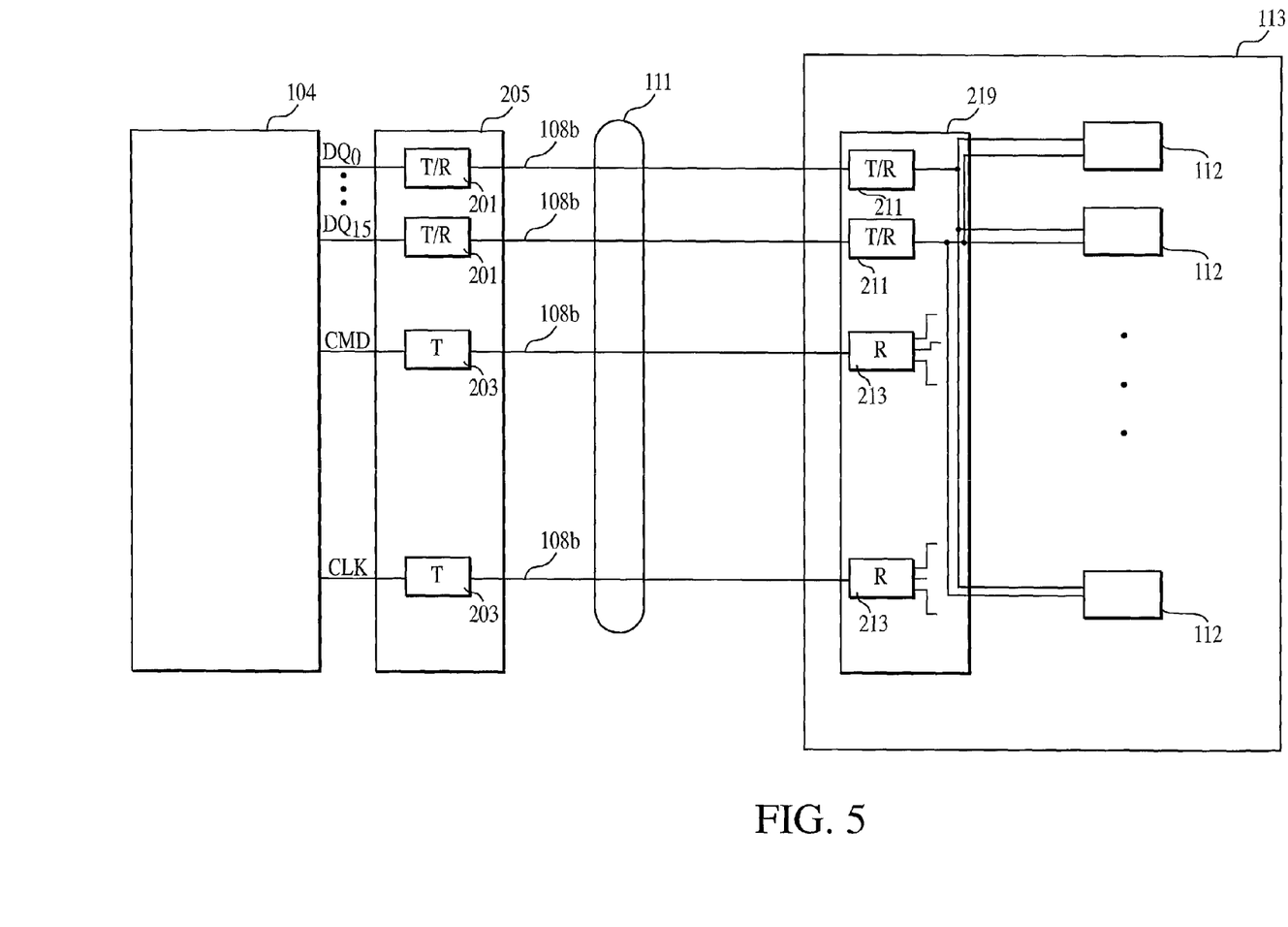
FIG. 5 shows a third exemplary embodiment of the invention.

FIG. 5 shows another embodiment of the invention, which utilizes an optical link 108b for each data path on an optical bus 111. In this embodiment there is a one-to-one replacement of an electrical bus line which normally interconnects memory controller 104 with a memory module 113 with an optical link 108b. For simplicity, FIG. 5 only shows four such optical links (two DQ, one CMD and a CLK path). The individual optical links 108b connect with transmitter/receivers 211 or receivers 213 on the memory modules which convert the optical signals to electrical signals for use by memory devices 112 and electrical signals to optical signals for data read from the memory devices 112.

As seen, there are several different techniques of optical data transmission which can be used on the optical link 108 in the present invention. These techniques can include but are not limited to Time Division Multiplexing (TDM). Using TDM, data from multiple pins can be used to occupy a single optical channel. Also, TDM can be used in conjunction with other optical data transmission schemes to reduce the number of optical channels (either fiber or wavelength) needed within an optical system. Two more examples of such techniques are Wavelength Division Multiplexing (WDM) and Frequency Division Multiplexing (FDM). Additionally, data compression techniques can be used. Such techniques have in common that they reduce the volume of data transmitted, the number of optical channels needed, or both.

An embodiment of the present invention using WDM is shown in FIG. 2. WDM enables the simultaneous transmission of multiple data channels on the same physical optical link, by utilizing several different wavelengths on that optical link at the same time. An optical multiplexer (mux) portion of the multiplexer/demultiplexer 207, 209 combines different wavelength bands from individual optical sources into a multiple wavelength light beam for simultaneous transmission through a common optical link. At the receiving end of the optical link, an optical demultiplexer (demux) portion of a multiplexer/demultiplexer 209 demultiplexes or spatially disburses collimated multiple wavelength light from the optical link into separate wavelength bands, each of which can be directed to an individual optical receiver. Although FIG. 2 shows combination of multiplexer/demultiplexer devices 207, 209 it should be apparent that separate multiplexers and demultiplexers can be used as well to perform the required multiplexing and demultiplexing functions. Another optical transmission technique, as shown in FIG. 5, uses a separate optical link for each data path.

It should also be noted that although all data paths (e.g., write/read (also referred to herein as "read/write" or "read and write") data (DQ), command (CMD), address (ADD), clock (CLK) between the memory controller 104 and modules 113 are shown as utilizing optical transmission, it is also possible to use optical transmission only on the high speed data paths, e.g., the write/read data (DQ) and clock (CLK) paths and utilize conventional electrical bus lines for slower speed data paths, e.g. command (CMD), address (ADD).

The present invention can use any modulation format in the optical link to optimize either Signal to Noise Ration (SNR) or bandwidth utilization. This could include conventional digital modulation techniques such as FM or Non Return To Zero (NRTZ).

Figure 6:
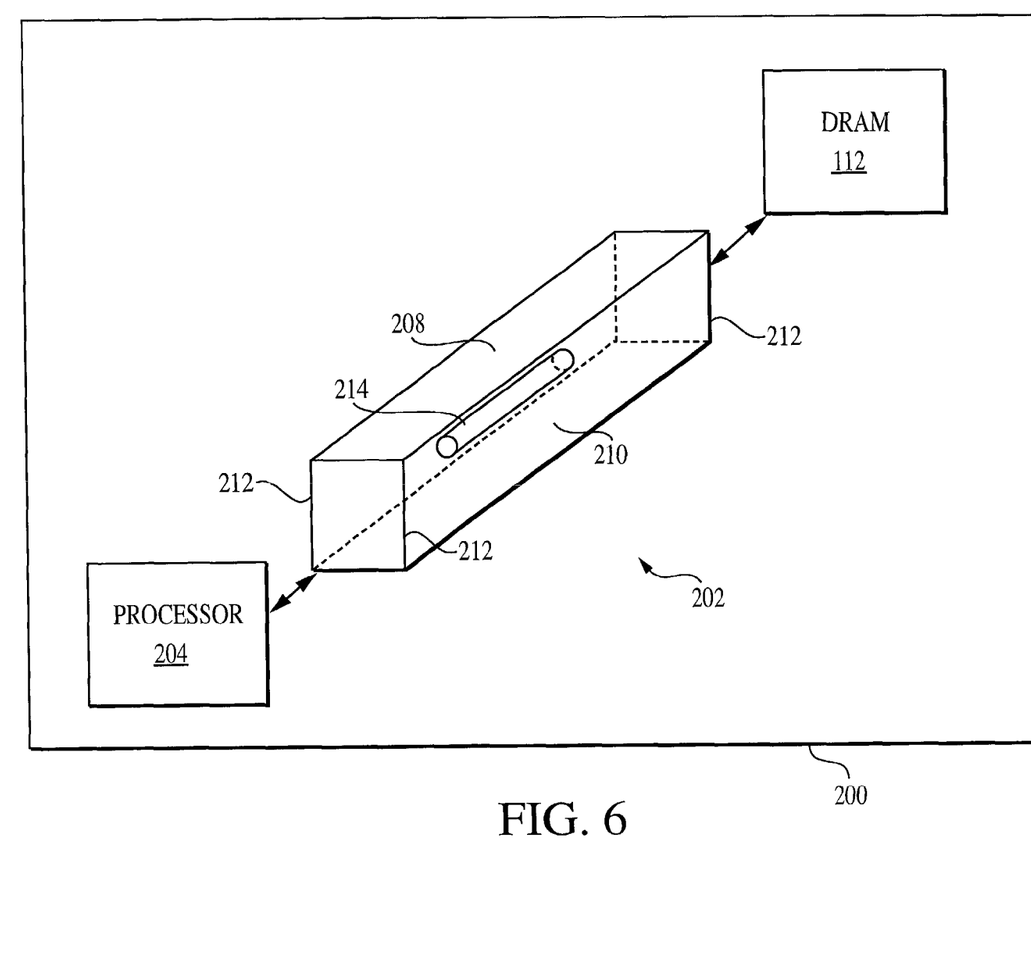
FIG. 6 shows a fourth exemplary embodiment of the invention.

The processor 100, controller 104, and memory devices 112 are typically located on separate dies with the memory devices being mounted on modules 113 which connect with the optical link 108a or 108b. However, it is also possible to integrate the processor and memory devices on the same die, with the processor incorporating the functions of the memory controller or with the memory controller also being integrated on the processor die. In the case where they are located on the same die, an integrated optical waveguide can be used to link them. FIG. 6, for example, shows an exemplary confined square pipe waveguide 212. Positioned on die 200, the waveguide 202 connects a processor with an integrated memory controller with DRAM 112. The waveguide 200 has a first metal layer 208 on top, a second metal layer 210 on the bottom, end plates 212 connecting the top and bottom layers, and an optically transmissive insulator 214 in middle through which light pulses carrying data are transmitted. The two metal layers (208, 210) act as waveguides confining the light pulses. The insulator 214 could be made of SiO2 which is commonly used in chip formation. Furthermore, in those configurations where the processor 204 and memory devices 206 are not on the same wafer or die and the module 113 and controller 104 are omitted, the waveguide 202 could also be implemented in freespace (air or vacuum).

Figure 7:
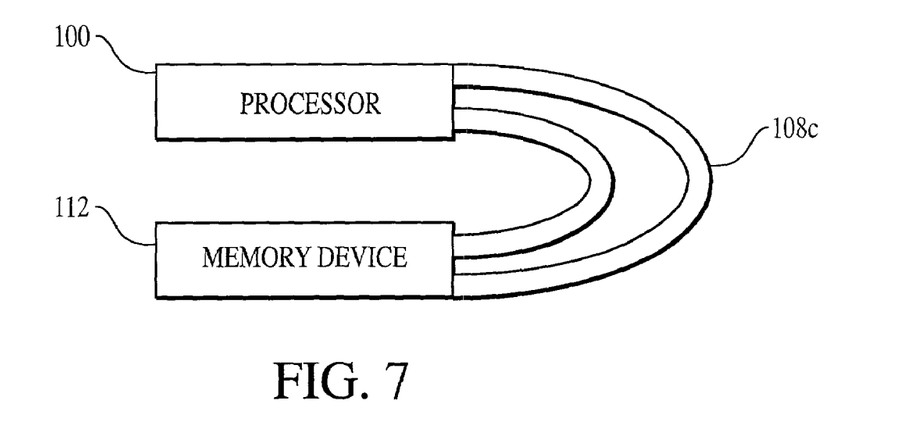
FIG. 7 shows a fifth embodiment of the invention.

FIG. 7 shows an optical link 108c in the form of a flexible optical fiber. Using such a fiber, a processor 100 and memory devices 112 can be integrated on separate dies residing in separate planes and packaged separately or together, with the processor 100 and memory devices 112 being interconnected by the flexible optical fiber 108c. This allows easier fabrication of the bus lines as well as non-planar stacking of processor 100 and DRAM devices 112 in separate or common packaging.

All of the above embodiments have in common that they achieve electrical isolation between the memory device 112 and the controller 104. They also make the optical link 108a, 108b, and 108c interconnections immune to noise, including at high frequency. Because the link is operated at high frequency, the clock signal for latching in data is sent with the data. Because fiber optic links do not affect pulse shape as do conventional electrical links, the memory devices 112 can be placed a greater distance from the controller 104 than is conventional. An additional advantage of the invention is that fiber optic links have lower power dissipation than conventional electrical links. This is because fiber optic links do not require I/O buffers, which consume power and also slow the propagation rate at which data is transferred.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

The invention claimed is:

1. A memory system comprising:
   a memory controller;
   a bi-directional optical link for transmitting data to and from the memory controller;
   at least one memory storage device, each at least one memory storage device comprising a memory-side electro-optical converter coupled to the bi-directional optical link;
   a controller-side electro-optical converter for converting communications between the memory controller and the bi-directional optical link;
   a wave length detector for detecting a wave length of optical signals sent from the controller-side electro-optical converter and supplying the detected wave length to the memory controller; and
   a wave length adjuster for adjusting the wave length of the optical signals based upon the detected wave length received from the memory controller.

2. The memory system of claim 1, wherein said memory controller and said at least one memory storage device are arranged and configured to exchange data exclusively through said optical link.

3. The memory system of claim 1, wherein said memory controller and said at least one memory storage device are arranged and configured to exchange read/write data through said optical link.

4. The memory system of claim 1, wherein said bi-directional optical link comprises a plurality of multiplexed optical channels.

5. The memory system of claim 4, further comprising:
a multiplexer optically connected with said memory controller arranged and configured for multiplexing said optical channels, and
a demultiplexer optically connected with said at least one memory storage device arranged and configured for demultiplexing said multiplexed optical channels.

6. The memory system of claim 4, further comprising:
a multiplexer optically connected with said at least one memory storage device arranged and configured for multiplexing optical channels and providing multiplexed optical channels to said bi-directional optical link; and
a demultiplexer optically connected with said memory controller arranged and configured for demultiplexing said multiplexed optical channels.

7. The memory system of claim 4, further comprising:
a respective optical multiplexer and demultiplexer on each end of said bi-directional optical link.

8. The memory system of claim 7, wherein said respective optical multiplexer and demultiplexer are arranged and configured to convert signal data that includes at least read/write data.

9. The memory system of claim 7, wherein said signal data includes command data.

10. The memory system of claim 7, wherein said signal data includes address data.

11. The memory system of claim 7, said signal data includes a clock signal.

12. The memory system of claim 7, wherein said signal data includes control data.

13. The memory system of claim 7, further comprising:
electrical data paths connected between said memory controller and said at least one memory storage device.

14. The memory system of claim 4, wherein said plurality of multiplexed optical channels use Time Division Multiplexing (TDM).

15. The memory system of claim 4, wherein said plurality of multiplexed optical channels use Wave Division Multiplexing (WDM).

16. The memory system of claim 4, wherein said plurality of multiplexed optical channels use Frequency Division Multiplexing (FDM).

17. The memory system of claim 1, wherein said optical path optically passes compressed data.

18. The memory system of claim 1, wherein said at least one memory storage device is located on a memory module.

19. The memory system of claim 18, further comprising:
an optical coupler disposed at said memory module arranged and configured to connect said memory storage device to said bi-directional optical link.

20. The memory system of claim 1, wherein said memory controller is arranged and configured to provide wavelength adjustment information to said wave length adjuster.

21. The memory system of claim 1 wherein said data includes read/write data which originates on a plurality of electrical paths, said bi-directional optical link comprising a plurality of discrete optical guides respectively associated with said plurality of electrical paths.

22. The memory system of claim 1 wherein said data includes command data which originates on a plurality of electrical paths, said bi-directional optical link comprising a plurality of discrete optical guides respectively associated with said plurality of electrical paths.

23. The memory system of claim 1 wherein said data includes address data which originates on a plurality of electrical paths, said bi-directional optical link comprising a plurality of discrete optical guides respectively associated with said plurality of electrical paths.

24. The memory system of claim 1 wherein said data includes clock signal data which originates on an electrical path, said bi-directional optical link comprising a discrete optical guide respectively associated with said electrical path.

25. The memory system of claim 1 wherein said data includes control signal data which originates on an electrical signal path, said bi-directional optical link comprising a discrete optical guide associated with said electrical signal path.

26. The memory system of claim 1, further comprising:
a processor, for communicating with said at least one memory storage device, wherein said memory controller, at least one memory storage device, processor, and bi-directional optical link are all integrated on the same die.

27. A method of operating a memory system comprising:
receiving an electrical signal output from a memory controller;
converting said electrical signal output from said memory controller to an optical signal for transmission on an optical path;
obtaining wavelength information from the optical signal on said optical path;
providing said wavelength information to said memory controller;
receiving the wavelength information from the memory controller;
generating wavelength adjustment information based upon the wavelength information;
providing said wavelength adjustment information to the memory controller;
adjusting the wavelength of said optical path based on wavelength adjustment information received from the memory controller; and
transmitting said optical signal over the optical path directly to a memory module.

28. The method of claim 27, further comprising:
said memory controller receiving data from said memory module through said optical path.

29. The method of claim 28, wherein said data includes at least one of read/write data.

30. The method of claim 28, wherein said data includes address data transmitted from said memory controller to said memory module.

31. The method of claim 28, wherein said data includes command data transmitted from said memory controller to said memory module.

32. The method of claim 28, wherein said data includes a clock signal.

33. The method of claim 28, wherein said data includes control data.

34. The method of claim 28, wherein said optical path comprises a plurality of multiplexed optical channels, said data being transmitted over said multiplexed optical channels.

35. The method of claim 34, further comprising:
multiplexing said optical channels, and
demultiplexing said multiplexed optical channels.

36. The method of claim 34, further comprising:
multiplexing optical channels and providing multiplexed optical channels to said optical path; and
demultiplexing said multiplexed optical channels.

37. The method of claim 34, further comprising:
an optical multiplexer and demultiplexer located on each side of said optical path.

38. The method of claim 34, wherein said plurality of multiplexed optical channels use Time Division Multiplexing (TDM).

39. The method of claim 34, wherein said plurality of multiplexed optical channels use Wave Division Multiplexing (WDM).

40. The method of claim 34, wherein said plurality of multiplexed optical channels use Frequency Division Multiplexing (FDM).

41. The method of claim 27, further comprising:

an optical coupler at said memory module, having a connector for connecting with said optical path.

42. The method of claim 27, further comprising:

combining a plurality of electrical paths between said memory controller and memory module into a single optical path between said memory controller and memory module.

43. The method of claim 42 wherein said single optical path further passes command data between said memory controller and memory module.

44. The method of claim 42 further comprising:

passing address data between said memory controller and memory module along said single optical path.

45. The method of claim 27, further comprising:

integrating a processor for communicating with said memory module with said memory controller, memory module, and optical path all within the same die.

46. The method of claim 27, wherein said step of transmitting further comprises transmitting compressed data.

* * * * *

UNITED STATES PATENT AND TRADEMARK OFFICE
CERTIFICATE OF CORRECTION

| | | |
|---|---|---|
| PATENT NO. | : 7,941,056 B2 | Page 1 of 1 |
| APPLICATION NO. | : 09/941557 | |
| DATED | : May 10, 2011 | |
| INVENTOR(S) | : Russel J. Baker et al. | |

It is certified that error appears in the above-identified patent and that said Letters Patent is hereby corrected as shown below:

On the Title Page
Item (57), under "Abstract", line 1, delete "A" and insert -- An --, therefor.

In column 7, lines 12-13, in Claim 6, delete "link ;" and insert -- link; --, therefor.

In column 7, line 28, in Claim 11, before "said" insert -- wherein --.

Signed and Sealed this
Twenty-eighth Day of June, 2011

David J. Kappos
*Director of the United States Patent and Trademark Office*